United States Patent

Keramat et al.

(10) Patent No.: US 9,893,737 B1
(45) Date of Patent: Feb. 13, 2018

(54) MULTI-STAGE OVERLOAD PROTECTION SCHEME FOR PIPELINE ANALOG-TO-DIGITAL CONVERTERS

(71) Applicant: Apple Inc., Cupertino, CA (US)

(72) Inventors: Mansour Keramat, San Jose, CA (US); KiYoung Nam, Los Altos, CA (US); Vijay Srinivas, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/406,077

(22) Filed: Jan. 13, 2017

(51) Int. Cl.
*H03M 1/06* (2006.01)
*H03M 1/12* (2006.01)
*H03K 5/24* (2006.01)
*H03K 5/08* (2006.01)

(52) U.S. Cl.
CPC ............. *H03M 1/124* (2013.01); *H03K 5/08* (2013.01); *H03K 5/24* (2013.01)

(58) Field of Classification Search
CPC ...... H03M 1/129; H03M 1/069; H03M 1/163; H03M 1/124; H03K 5/08; H03K 5/24
USPC .................................................. 341/118, 161
See application file for complete search history.

(56) References Cited

U.S. PATENT DOCUMENTS

| | | | |
|---|---|---|---|
| 6,480,135 B2 | 11/2002 | Gendai | |
| 6,741,194 B1* | 5/2004 | Cassagnes | H03M 1/129 341/118 |
| 6,803,873 B1* | 10/2004 | Motomatsu | H03M 1/0695 341/155 |
| 7,750,834 B2* | 7/2010 | Sasaki | H03M 1/08 341/156 |
| 7,786,909 B2* | 8/2010 | Udupa | H03M 1/129 341/118 |
| 8,018,274 B1* | 9/2011 | Bales | H03F 3/005 327/124 |
| 8,120,388 B2 | 2/2012 | Shimizu | |
| 8,344,927 B2* | 1/2013 | Jeon | H03M 1/1019 327/307 |
| 8,928,504 B2 | 1/2015 | Su | |

* cited by examiner

*Primary Examiner* — Khai M Nguyen
(74) *Attorney, Agent, or Firm* — Meyertons, Hood, Kivlin, Kowert & Goetzel, P.C.

(57) ABSTRACT

An apparatus includes a series of analog-to-digital converter (ADC) stages and a comparison circuit coupled to a first ADC stage. The first ADC stage may be configured to compare an input signal to one or more conversion thresholds to generate a result. The first ADC stage may also be configured to generate an output signal based on a value of the result. In response to an assertion of a reset signal, the first ADC stage may be configured to set a level of the output signal voltage to a particular voltage. The comparison circuit may be configured to assert the reset signal in response to a determination that the input signal voltage exceeds an operating range defined by an upper overload threshold voltage and a lower overload threshold voltage.

20 Claims, 7 Drawing Sheets

MULTI-STAGE OVERLOAD PROTECTION SCHEME FOR PIPELINE ANALOG-TO-DIGITAL CONVERTERS

BACKGROUND

Technical Field

Embodiments described herein are related to the field of mixed-signal circuits used in semiconductor devices. More particularly, these embodiments relate to analog-to-digital converter circuits.

Description of the Related Art

Some integrated circuits (IC), such as systems-on-chip (SoC) for example, may process or analyze one or more analog signals. Analog signals may be received from a source external to the SoC or be generated within the SoC. To sample a voltage level of an analog signal at a given point in time, one or more analog to digital converters (ADCs) may be included in the SoC. Various ADC architectures may be used in an SoC, including, for example, successive approximation ADCs, sigma-delta ADCs, and pipelined ADCs. A pipelined ADC is an architecture in which a first ADC stage of a series of ADC stages compares an input signal to a conversion threshold voltage. The first ADC stage generates a portion of a digital result based on the comparison, and outputs both this portion of the digital result as well as an analog signal to a next ADC stage for a next comparison. A complete digital result from the pipelined ADC may correspond to a combination of respective portions from each ADC stage.

SUMMARY OF THE EMBODIMENTS

Various embodiments of an analog-to-digital converter (ADC) are disclosed. Broadly speaking, an apparatus includes a series of analog-to-digital converter (ADC) stages, and a comparison circuit coupled to the first ADC stage of the series of ADC stages. An input of a first ADC stage of the series of ADC stages may be coupled to an input signal. The first ADC stage may be configured to compare a voltage level of the input signal to one or more conversion threshold levels to generate a result in response to a transition of a clock signal, and to generate an output signal of the first ADC stage based on a value of the result. In response to an assertion of a first reset signal, the first ADC stage may be configured to set a voltage level of the output signal to a particular voltage level. The comparison circuit may be configured to assert the first reset signal in response to a determination that the voltage level of the input signal is outside of an operating range defined by an upper overload threshold level and a lower overload threshold level.

In a further embodiment, the comparison circuit may also be configured to set the upper overload threshold level based on a maximum allowable voltage level of the first ADC stage, and to set the lower overload threshold level based on a minimum allowable voltage level of the first ADC stage. In one embodiment, an input of a second ADC stage may be coupled to the output signal of the first stage and an output of the second ADC stage may be coupled to an input of a third ADC stage. The input of the third ADC stage may be coupled to a respective comparison circuit.

In an embodiment, a respective input of each ADC stage of a subset of the series of ADC stages may be coupled to a respective comparison circuit. In a further embodiment, at least one comparison circuit coupled to at least one ADC stage of the subset may be configured to assert a respective reset signal in response to a determination that a voltage level of its respective input is outside of a first operating range defined by a first upper overload threshold level and a first lower overload threshold level. In another embodiment, remaining comparison circuits coupled to respective remaining ADC stages of the subset may be configured to assert a respective reset signal in response to a determination that a voltage level of their respective inputs is outside of a second operating range defined by a second upper overload threshold level and a second lower overload threshold level. The second upper overload threshold level may be different than the first upper overload threshold level and the second lower overload threshold level may be different than the first lower overload threshold level.

In one embodiment, the apparatus may further include a synchronization circuit coupled to a second ADC stage of the series of ADC stages. In response to another transition of the clock signal and in response to the assertion of the first reset signal, the synchronization circuit may be configured to assert a second reset signal, coupled to the second ADC stage. An input of a second ADC stage may be coupled to the output signal.

BRIEF DESCRIPTION OF THE DRAWINGS

The following detailed description makes reference to the accompanying drawings, which are now briefly described.

DETAILED DESCRIPTION

Figure 1:
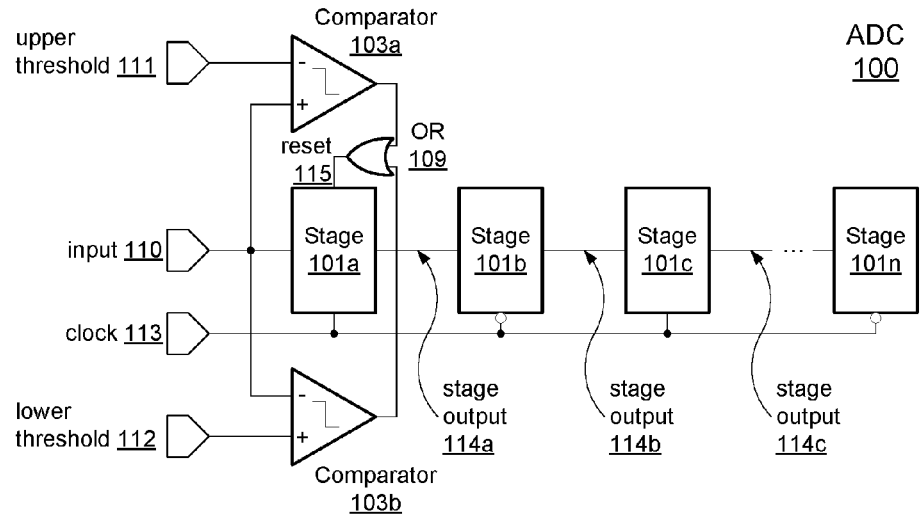
FIG. 1 illustrates a block diagram of an embodiment of an analog-to-digital converter (ADC).

A pipelined ADC includes a series of ADC stages in which an input signal is sampled and compared to one or more conversion threshold voltages in each of the series of ADC stages. Based on a first comparison, the first ADC stage generates a portion of a digital result, for example, one bit or several bits of a plurality of data bits included in the digital result. The first ADC stage outputs both this portion of the digital result as well as an analog signal based on the comparison. Each subsequent ADC stage, in turn, generates a portion of the digital result and outputs an analog signal based on the respective stage's comparison. A complete digital result from the pipelined ADC may correspond to a combination of the respective portions from each of the series of ADC stages.

The signal output from each stage to a subsequent stage may be amplified. Under some conditions, a voltage level of an input signal to a given ADC stage may exceed a safe range of input voltages for the stage. If the voltage level of the input signal exceeds the safe input range, then the given ADC stage may temporarily malfunction, or may be damaged. Excessive voltage levels at an input of one or more stages of a pipelined ADC may cause inaccurate performance. Under some conditions, the excessive voltage may damage circuits, rendering the ADC inoperable. For example, excessive voltage may cause damage to transistors coupled to an input node, causing the transistors to cease operating or operate improperly. Novel designs for protecting stage circuits of a pipelined ADC are described herein.

It is noted that as used herein, the terms "first ADC stage," "first stage," "second ADC stage," and "second stage," are intended to denote an order to the series of ADC stages. For example, unless stated otherwise, a "first ADC stage" refers to an initial stage of a pipelined ADC that receives the input signal to convert. A "second ADC stage," therefore, refers to the subsequent ADC stage that receives an output of the first ADC stage as an input signal to convert.

Many terms commonly used in reference to SoC designs are used in this disclosure. For the sake of clarity, the intended definitions of some of these terms, unless stated otherwise, are as follows.

A Metal-Oxide Semiconductor Field-Effect Transistor (MOSFET) describes a type of transconductive device that may be used in modern digital logic designs. MOSFETs are designed as one of two basic types, n-channel and p-channel. N-channel MOSFETs open a conductive path between the source and drain when a positive voltage greater than the device's threshold voltage is applied between the gate and the source. P-channel MOSFETs open a conductive path when a voltage greater than the device's threshold voltage is applied between the source and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel device on, i.e., opens a conductive path, and turns a p-channel MOSFET off, i.e., closes a conductive path. Conversely, a low level on the gate of a MOSFET turns a p-channel on and an n-channel off. In addition, the term transconductance is used in parts of the disclosure. While CMOS logic is used in the examples, it is noted that any suitable digital logic process may be used for the circuits described in this disclosure.

It is noted that "high," "high level," and "high logic level" refer to a voltage sufficiently large to turn on a n-channel MOSFET and turn off a p-channel MOSFET while "low," "low level," and "low logic level" refer to a voltage that is sufficiently small enough to do the opposite. As used herein, a "logic signal" refers to a signal that transitions between a high logic level and a low logic level. In various other embodiments, different technology may result in different voltage levels for "low" and "high."

The embodiments illustrated and described herein may employ CMOS circuits. In various other embodiments, however, other suitable technologies may be employed.

In FIG. 1, a block diagram of an embodiment of an analog-to-digital converter (ADC) is illustrated. ADC 100 is an embodiment of a pipelined ADC, which may be included in an SoC device. ADC 100 includes multiple stages, Stage 101a through Stage 101n, collectively referred to as Stages 101. ADC 100 also includes comparison circuits Comparator 103a and Comparator 103b, as well as logic circuit OR gate 109. Several signals are received by ADC 100, including input signal 110, upper overload threshold 111, lower overload threshold 112, and clock 113.

In the illustrated embodiment, ADC 100 receives input signal 110 and generates a digital value that is indicative of a voltage level of input signal 110. The digital value is a series of binary digits that form a numeric value that corresponds to a voltage level at a point in time when a sample of input signal 110 is taken. Each of Stages 101 generates a portion of the digital value, with the digital value including the results of each of Stages 101. Stage 101a generates its portion of digital by comparing input signal 110 to one or more conversion threshold voltages, and saves the portion of the digital value in a register. Based on a result of the comparison, Stage 101a also generates stage output 114a that is provided to the next stage in the pipelined, Stage 101b. Stage 101b then compares stage output 114a to the one or more conversion threshold voltages and, similarly, generates its portion of the digital value as well as stage output 114b. This process repeats until each of Stages 101 has generated a respective portion of the digital value. Upon the last stage, Stage 101n, generating its portion, the digital value is determined by combining a portion from each of Stages 101. It is noted that, being the last stage, Stage 101n may not generate a respective stage output signal. The process from sampling the voltage level of input signal 110 to generating the corresponding digital value is referred to herein as an "ADC conversion" or simply a "conversion."

Clock 113 is used to control the timing of the conversion through ADC 100. Clock 113 toggles between a high clock phase (a period of time when a clock signal is at a high logic level) and a low clock phase (when the clock signal is at a low logic level). Each of Stages 101 may perform one of two functions during each clock phase, either sampling an input signal, or holding and comparing the sampled signal. The sampling function may, in some embodiments, include charging one or more circuit nodes to the voltage level of the input signal. At the end of the sampling function, the comparison to the one or more conversion threshold voltages is performed. During the hold function, each of Stages 101 may generate its respective stage output 114 for the next stage to sample. In some embodiments, each successive stage of Stages 101 may alternate between the sampling function and the hold function. For example, Stage 101a may sample during the high phase of clock 113 and hold during the low phase. Stage 101b then holds during the high phase and samples during the low phase. In this manner, Stage 101b samples stage output 114a while Stage 101a is holding stage output 114a steady. The voltage level of stage output 114a may then vary based on input signal 110 when Stage 101a moves back to the sampling function, at which time, Stage 101b moves to the hold function.

In the illustrated embodiment, a single clock signal, clock 113, is shown. In other embodiments, two or more clock signals may be utilized, with the phases of the clocks shifted to control the relative timing of the sample and hold phases for different Stages 101. In one embodiment, two clocks may be used that have less than 50% duty cycles, i.e., the clock signals are high for less time than they are low. Such an embodiment may allow for a small (relative to the overall clock period) time period in which neither clock signal is high. Stages 101 may use this small time period to perform actions such as, for example, determine their portion of the digital value, determine an output voltage level for the subsequent Stage 101, and/or other suitable actions.

Stage 101a generates stage output 114a based on a voltage level of input signal 110. Stage 101a, as previously stated, compares the voltage level of input signal 110 to one or more conversion threshold voltages and generates its portion of the digital value based on these comparisons. In the illustrated embodiment, each of Stages 101 compares its respective input signal to an upper conversion threshold signal and a lower conversion threshold signal. In other embodiments, the number of conversion threshold signals used in the comparison may differ. The voltage level of stage output 114a is also based on these comparisons. For example, Stage 101a, in the illustrated embodiment, samples input signal 110 and then, after the sample phase, compares the sampled voltage level to voltage levels of the upper conversion threshold signal and the lower conversion threshold signal. If the sampled voltage level is above the level of the upper conversion threshold signal, then the voltage level of stage output 114a is based on the sampled voltage level minus a voltage level determined by the comparison result. Similarly if the sampled voltage level is below the level of the lower conversion threshold signal, then the voltage level of stage output 114a is also based on the sampled voltage level minus the voltage level determined by the comparison result. If the sampled voltage level is between the levels of the upper and lower conversion threshold signals, then the voltage level of stage output 114a is based on the sampled voltage level. The voltage level of stage output 114a is then amplified before being sent to Stage 101b.

The input and sampling circuits for each of Stages 101 may have a limited input voltage range. Input voltage levels exceeding the allowable input voltage range may cause inaccurate conversions, or may damage the circuits. To provide at least some protection against the voltage level of input signal 110 exceeding the allowable input voltage range, Comparators 103a and 103b are coupled to the input of Stage 101a. Comparator 103a compares the sampled voltage level of input signal 110 to upper overload threshold 111, and asserts an output into one input of OR gate 109 if the sampled voltage level of input signal 110 is higher. In parallel, Comparator 103b compares the sampled voltage level of input signal 110 to lower overload threshold 112, and asserts an output into another input of OR gate 109 if the sampled voltage level of input signal 110 is lower. If either of the inputs to OR gate 109 is asserted, then reset 115 is asserted. The assertion of reset 115 causes Stage 101a to enter a protective reset state.

In the illustrated embodiment, Stage 101a enters the reset state at the end of a sample phase. In other embodiments, Stage 101a may enter the reset state at any other suitable time once the sampled input signal has been compared to the upper and lower overload thresholds 111 and 112. The entry of Stage 101a into the reset state may include any of various actions. For example, the voltage level of stage output 114a may be set to a particular voltage level, or to a ground reference signal. In some embodiments, Stage 101a may cease generating stage output 114a. Stage 101a may remain in this reset state until both inputs of OR gate 109 are de-asserted.

The voltage levels of upper overload threshold 111 and lower overload threshold 112 may correspond to the maximum and minimum input voltage levels (also referred to herein as the maximum and minimum voltage levels) allowable for Stage 101a that allow for acceptable accuracy of the ADC conversions and avoid damaging sensitive circuits in Stage 101a. In an IC manufacturing process, however, mass-producing the circuits of Comparators 103a and 103b such that they consistently assert their respective outputs at precisely the correct voltage levels on their respective inputs may be cost prohibitive. In practice, over a volume of ICs that each include a respective ADC 100, Comparators 103a and 103b may have a range of accuracies. To avoid versions of ICs with ADC 100 from having a Comparators 103a or 103b that assert at too high or too low of a voltage level, some embodiments may set the voltage level of upper overload threshold 111 at a predetermined voltage level that is less than the maximum input voltage level. In such embodiments, lower overload threshold 112 may similarly be set to a predetermined voltage level that is greater than the minimum input voltage level.

It is noted that ADC 100 of FIG. 1 is merely an example for demonstration of disclosed concepts. Some functional components and some operational details have been omitted to focus on the disclosed subject matter. In other embodiments, additional circuit elements may be included and operation may deviate from the description above.

Figure 2:
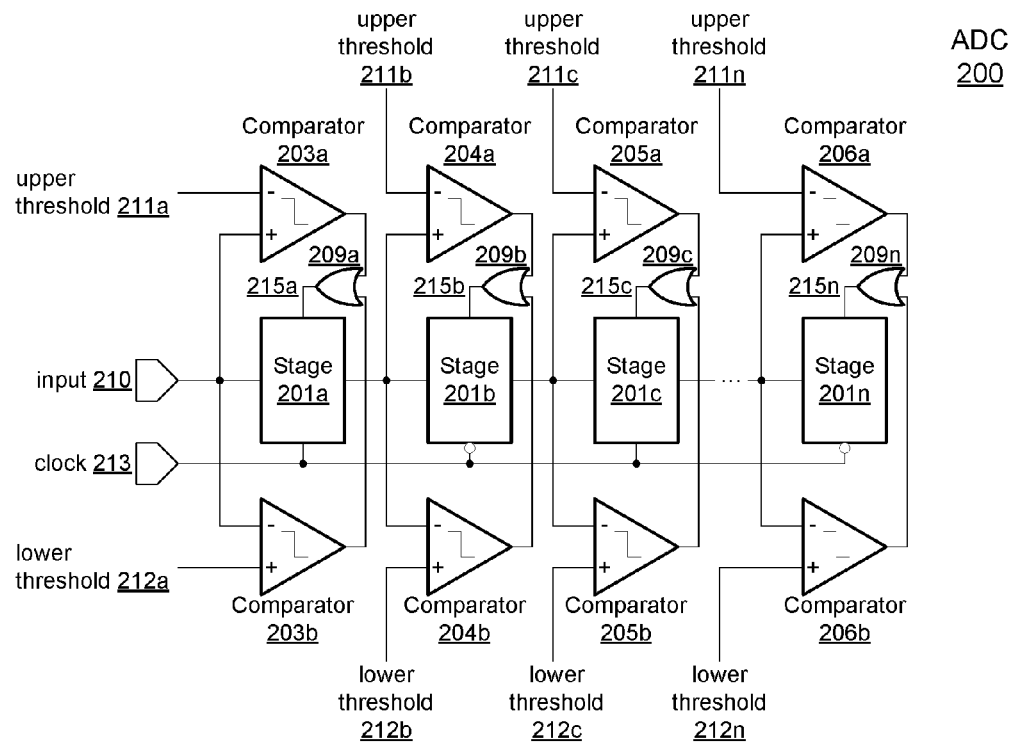
FIG. 2 shows a block diagram of a second embodiment of an ADC.

Turning to FIG. 2, a block diagram of a second embodiment of an ADC is shown. Similar to ADC 100 in FIG. 1, ADC 200 is another embodiment of a pipelined ADC, which may be included in an SoC device. ADC 200 includes Stage 201a through Stage 201n, collectively referred to as Stages 201, as well as comparison circuits Comparators 203a through 206a, and Comparators 203b through 206b. A respective logic circuit from OR gate 209a through OR gate 209n is coupled to each of Stages 201. Received signals include input signal 210, upper overload threshold 211a-n, lower overload threshold 212a-n, and clock 213.

Similar to ADC 100, ADC 200 receives input signal 210 and generates a digital value that is indicative of a voltage level of input signal 210 at a time when input signal 210 is sampled. Except as disclosed below, operation of the components of ADC 200 is as described for the similarly named and numbered components of ADC 100.

The protection afforded by Comparators 103a and 103b to ADC 100, may be limited dependent on their accuracy. If each of Comparators 103a and 103b function as designed, then as long as Stage 101a is protected, the subsequent Stages 101b-101n should not require similar protection. As described above, the accuracy of Comparators 103a and 103b in mass production may result in the multiple versions of a circuit having a range of performance characteristics. Inaccuracies in Comparators 103a and/or 103b may allow input signals to pass that may result in overload conditions for one or more of Stages 101b-101n.

In the illustrated embodiment, ADC 200 includes additional comparison circuits, two for each Stage 201, to provide protection for each Stage 201, in the form of reset signals 215a through 215n. Comparators 203a and 203b, in combination with OR gate 209a, provide input protection for Stage 201a, as described above in regards to Comparators 103a and 103b and OR gate 109 provide for Stage 101a. Comparators 204a and 204b, in combination with OR gate 209b, provide similar input protection for Stage 201b. If the output of Stage 201a sampled by Stage 201b is greater than upper overload threshold 211b, or less than lower overload threshold 212b, then reset 215b is asserted by OR gate 209b. Stage 201b responds to the assertion of reset 215b by entering the protective reset state, as described above in regards to FIG. 1. In ADC 200, each of Stages 201 includes a respective protection circuit.

The voltage levels of upper overload threshold 211a-n and lower overload threshold 212a-n may correspond to the maximum and minimum voltage levels allowable for Stage 101a that allow for acceptable accuracy of the ADC conversions and avoid damaging sensitive circuits in Stage 101a. In other embodiments, upper overload threshold 211a-n and lower overload threshold 212a-n may be set to a predetermined voltage level that are less than the maximum allowable voltage level and greater than the minimum input voltage level, respectively. In some embodiments, each of upper overload threshold 211a-n and lower overload threshold 212a-n may be set individually as desired for each Stage 201a-n. For example, each of upper overload threshold 211a-n and lower overload threshold 212a-n may be trimmable within a predetermined voltage range during a production test process to compensate for inaccuracies of a particular Comparator 203-206.

Setting upper overload threshold 211a-n and lower overload threshold 212a-n to such that the input voltage levels are restricted to a less than maximum voltage range, may, however, reduce the ability of ADC 200 to receive and convert signals over the maximum allowable voltage range. In other words, the input voltage swing range (i.e., the range of voltage inputs from the upper overload threshold to the lower overload threshold) may be limited. In some embodiments, therefore, upper overload threshold 211a-n may be set a higher than the maximum allowable voltage level and the lower overload threshold 212a-n may be set a below the minimum allowable voltage level. Although such an embodiment may allow input voltage levels to exceed the allowable voltage range, since each of Stages 201 has a respective protection circuit, the input voltage for a given Stage 201 may be limited to the upper overload threshold 211a-n and the lower overload threshold 212a-n. Amplification of an excessive input voltage by a previous stage, therefore, may be caught by the subsequent stage, and the respective reset signal may be asserted.

Compared to ADC 100, ADC 200 may have increased protection for each stage, leading to improved accuracy and better reliability. ADC 200, however, may have an increased circuit size and power consumption from the additional comparators and OR gates in comparison to ADC 100.

It is noted that ADC 200 in FIG. 2 is merely an example. Other embodiments may include any suitable number of stages and corresponding protection circuits with capabilities to select overload threshold levels for each stage. Although an OR logic gate is shown in FIG. 2, any suitable combinational logic may be used to generate the reset signals.

Figure 3:
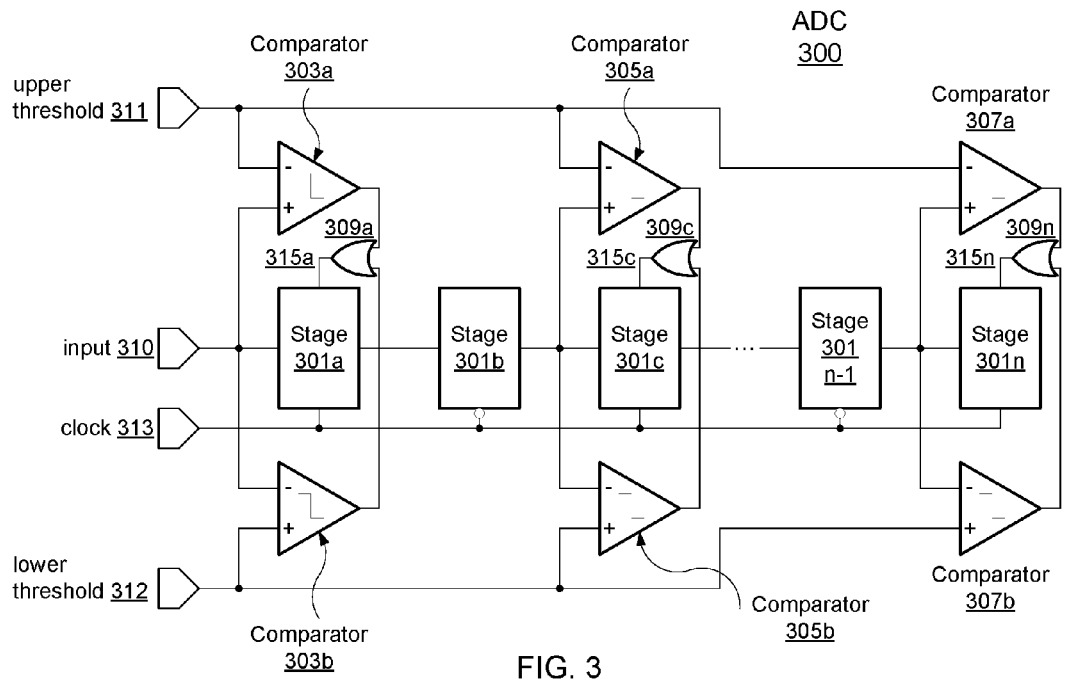
FIG. 3 illustrates a block diagram of a third embodiment of an ADC.

Moving to FIG. 3 a block diagram of a third embodiment of an ADC is illustrated. Similar to ADCs 100 and 200 in FIGS. 1 and 2, ADC 300 is another embodiment of a pipelined ADC, which may be included in an SoC device. ADC 300 includes Stage 301a through Stage 301n, collectively referred to as Stages 301, as well as comparison circuits Comparators 303a, 303b, 305a, 305b, 307a and 307b. Logic circuits OR gates 309a, 309c and 309n are coupled to Stages 301a 301c and 301n, respectively. Received signals include input signal 310, upper overload threshold 311, lower overload threshold 312, and clock 313.

ADC 300 is similar to ADC 200 and, therefore, the functional descriptions provided above for ADC 200 also apply to ADC 300, except as noted. In ADC 300, protection circuits are included for alternating Stages 301. In the illustrated embodiment, Stages 301a, 301c, and 301n are shown with protection circuits, while Stages 301b and 301n-1 are not. By alternating the protection circuits, rather than including them on each stage as in ADC 200, may reduce a number of components in comparison to ADC 200. The protection circuits may still provide adequate protection against output signals from previous stages by detecting out-of-range signals at the alternate stage of Stages 301. Protection, however, may not be as high as it is in ADC 200. Upper overload threshold 311 and lower overload threshold 312 may be set to levels that are less than the maximum allowable input voltage and greater than the minimum allowable input voltage, respectively, to compensate for the reduced level of protection. In other embodiments, upper overload threshold 311 and lower overload threshold 312 may be set equal to the maximum and minimum allowable input voltages, respectively.

It is noted that the embodiment of ADC 300 in FIG. 3 is an example for demonstrating disclosed concepts. In other embodiments, any suitable combinational logic may be used in place of OR logic gates to generate the reset signals. Similar to ADC 200 in FIG. 2, other embodiments may include any suitable number of stages and corresponding protection circuits, including capabilities to select the overload threshold levels for each stage.

Figure 4:
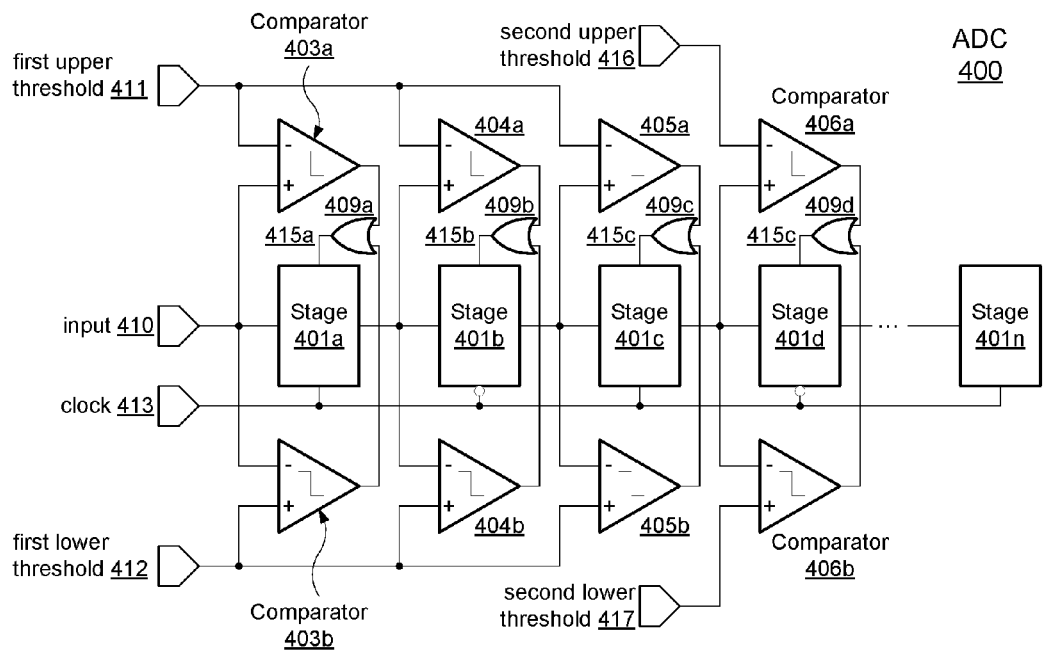
FIG. 4 depicts a block diagram of a fourth embodiment of an ADC.

Turning now to FIG. 4, a block diagram of a fourth embodiment of an ADC is shown. Similar to the previous embodiments in FIGS. 1, 2, and 3, ADC 400 is another embodiment of a pipelined ADC, which may be included in an SoC device. ADC 400 includes Stage 401a through Stage 401n, collectively referred to as Stages 401. Comparison circuits Comparators 403a through 406a and Comparators 403b through 406b are also included, with a pair of comparison circuits coupled to each of Stages 401a through 401d. Logic circuits OR gates 409a through 409d are coupled to Stages 401a through 401d. Input signal 410, first upper overload threshold 411, first lower overload threshold 412, clock 413, second upper overload threshold 416, and second lower overload threshold 417 are received signals.

ADC 400 is similar to ADC 200 and, therefore, the functional descriptions provided above for ADC 200 also apply to ADC 400, except as noted. In the illustrated embodiment of ADC 400, protection circuits are included for Stages 401a through 401d, with each protection circuit including two comparison circuits and one OR gate. Stages after Stage 401d, including Stage 401n, do not include protection circuits.

Comparators 403a, 404a, and 405a receive first upper overload threshold 411 and Comparators 403b, 404b, and 405b receive first lower overload threshold 412. In the illustrated embodiment, first upper overload threshold 411 may be set to a voltage level that is greater than the maximum allowable input voltage, while first lower overload threshold 412 may be set to a voltage level that is less than the minimum allowable input voltage. These settings may allow for a full range of allowable input voltages on input 410, as well as the inputs to Stages 401b and 401c, without limiting the input voltage swing range. In various embodiments, the voltage levels of first upper overload threshold 411 and first lower overload threshold 412 may be adjusted for an acceptable level of input protection versus an acceptable input swing range.

Comparator 406a receives second upper overload threshold 416 and Comparator 406b receives second lower overload threshold 417. Second upper overload threshold 416 and second lower overload threshold 417, in the illustrated embodiment, are set to different voltage levels than first upper overload threshold 411 and first lower overload threshold 412. Since Stage 401d is the last of Stages 401 to include input protection, second upper overload threshold 416 and second lower overload threshold 417 may be set to provide more protection than first upper overload threshold 411 and first lower overload threshold 412. Second upper overload threshold 416, therefore, may be set to a voltage level less than the maximum allowed input voltage, while second lower overload threshold 417 is set to a voltage level higher than the minimum allowed input voltage. These settings may reduce an input voltage swing range to Stage 401d in exchange for increased input protection. This increased input protection for Stage 401*d* may, inherently, provide protection to the remaining Stages 401.

Compared to ADC 200, the embodiment of ADC 400 may reduce a number of components. The protection circuits may still provide adequate protection against output signals from previous stages by detecting out-of-range signals at the first four stages of Stages 401. By properly choosing the upper and lower overload thresholds, ADC 400 can achieve both robust protection and minimal loss in the ADC input swing range.

It is noted that ADC 400 in FIG. 4 is one example for demonstration. Some circuit elements have been omitted for clarity. In other embodiments, any suitable combinational logic may be used in place of OR logic gates to generate the reset signals. Similar to ADC 200 in FIG. 2, other embodiments may include any suitable number of stages and corresponding protection circuits, and may include capabilities to select the overload threshold levels for each stage.

It is further noted that the ADC circuits represented in FIGS. 1-4 include an upper and a lower overload threshold level. In various other embodiments, any number of overload threshold values, and associated comparator circuits, may be implemented. A single threshold level may be implemented in some ADC circuits, for example, if the input signal is fully symmetric, or if the ADC circuit measures the absolute value of the input signal.

Figure 5:
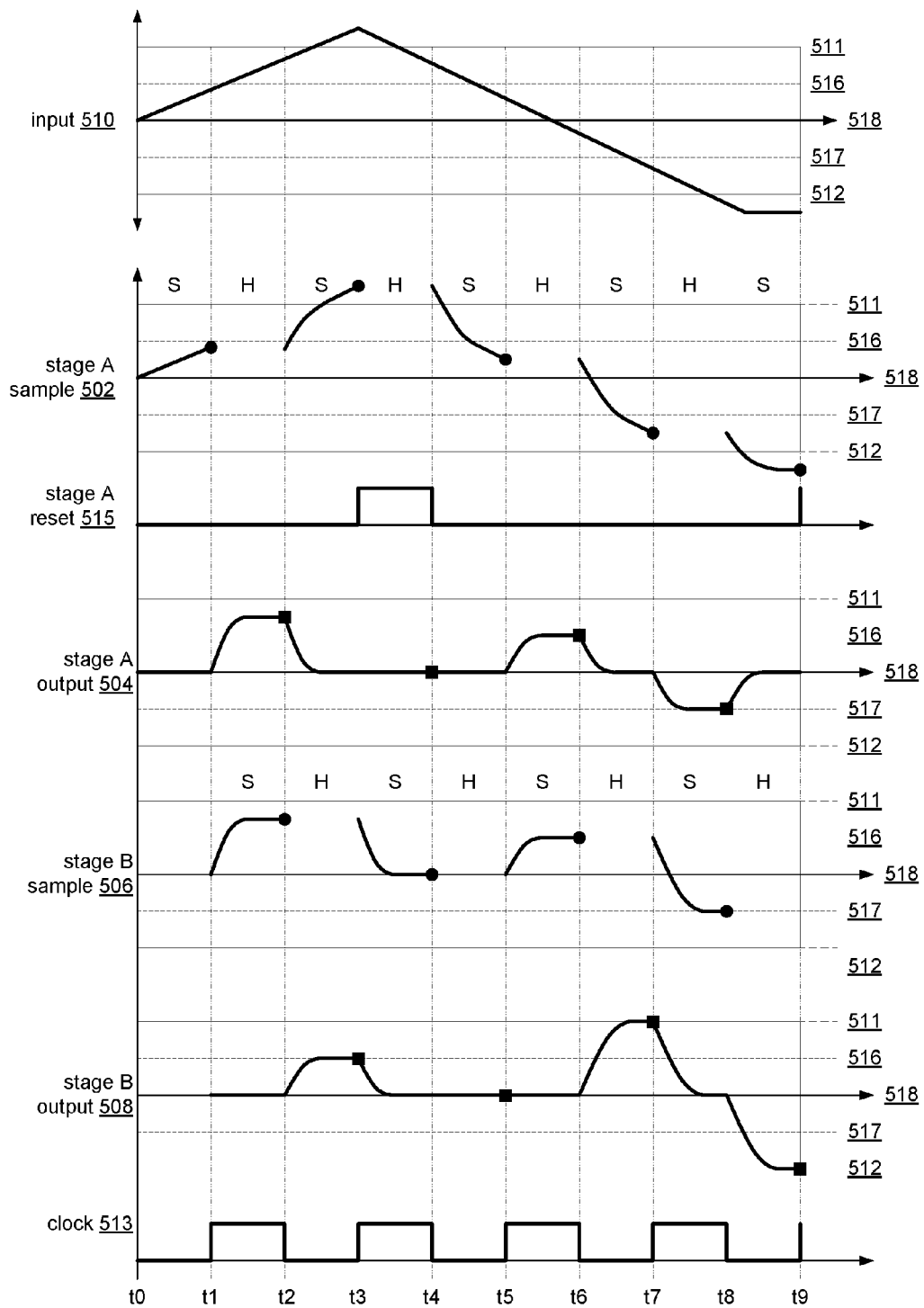
FIG. 5 shows a chart of possible signals associated with an ADC.

Moving now to FIG. 5, a chart of possible waveforms associated with an ADC is shown. Eight waveforms are illustrated, input 501, stage A sample 502, stage A reset 503, stage A output 504, stage B sample 506, stage B output 508, and clock 513. For select waveforms, lines are included to indicate upper overload threshold 511, lower overload threshold 512, upper conversion threshold voltage 516, and lower conversion threshold voltage 517. The middle line indicates ground reference 518. The waveforms of FIG. 5 may be applied to any of ADCs 100, 200, 300, or 400 in FIGS. 1-4, respectively. In the illustrated embodiment, the waveforms of FIG. 5 are described in reference to ADC 100.

In the illustrated embodiment, input 510 corresponds to input signal 110, stage A reset 515 corresponds to reset 115, stage A output 504 corresponds to stage output 114*a*, and stage B output 508 corresponds to stage output 114*b*. In addition, upper overload threshold 511 corresponds to upper overload threshold 111, lower overload threshold 512 corresponds to lower overload threshold 112, and clock 513 corresponds to clock 113. Stage A sample 502 and stage B sample 508 are examples of an internal signals that may correspond to sample and hold circuits within Stages 101*a* and 101*b*, respectively. For both stage A sample 502 and stage B sample 506, each phase of clock 513 is labeled with an "S" or an "H" to signify if the corresponding Stage 101 is in a sample or hold phase. During a sample phase, a Stage 101 couples an internal sampling circuit to the corresponding input, allowing the sampling circuit to track the voltage level of the input. Upon entering a hold phase, the respective input is decoupled from the sampling circuit and the voltage level of sampling circuit may be indeterminate while the Stage 101 generates a respective output signal for the input of the subsequent Stage 101.

It is noted that the sample and hold phases for Stage 101*a* and Stage 101*b* alternate for each clock 513 phase, i.e., Stage 101*a* samples while Stage 101*b* holds, and vice versa. In the illustrated example, a single clock signal, clock 513, is shown. As disclosed above, two or more clock signals may be utilized in other embodiments. The phases of the two or more clocks may be shifted to control the relative timing of the sample and hold phases for different Stages 101. The two or more clocks may also have less than 50% duty cycles to allow for a small (relative to the overall clock period) time period in which no clock signal is high. Stages 101 may use this small time period to perform actions such as, for example, determine their portion of the digital value, determine if a reset occurred, and/or other actions.

At time t0, ADC 100 may begin a conversion of input 510. Between times t0 and t1, Stage 101*a* samples input 510, tracking the voltage level of input 510. During this time, the Stage 101*a* output driver is off and stage A output 504 is pulled to ground reference 518. In various embodiments, the voltage level of stage A output 504 may be any suitable voltage, such as, for example, pulled to threshold voltages 516 or 517. Stage 101*b*, meanwhile, may be inactive if ADC 100 is performing a first conversion or in a hold phase corresponding to an earlier conversion if the current conversion is not the first.

At time t1, Stage 101*a* enters a hold phase, while Stage 101*b* enters a sample phase. The voltage level of Stage A sample 502 at time t1, emphasized by the circle, is converted to generate a portion of the digital value for Stage 101*a*. The sampling circuit of Stage 101*a* is then disabled and the voltage level of stage A sample 502 may be indeterminate, and therefore, stage A sample 502 is not shown during hold phases. Stage A output 504 ramps from ground reference 518 to an output that is twice the voltage level of the last sampled voltage level indicated by the circle. Stage B sample 506 samples stage A output 504 during this time period, and, therefore follows a similar voltage ramp. The output driver for Stage 101*b* is off during the hold phase and stage B output 508 is pulled to ground reference 518.

Arriving at time t2, Stage 101*a* switches back to a sample phase and Stage 101*b* switches to a hold phase. The voltage level of stage A output 504, indicated by the square, may determine the voltage level of stage B sample 506, indicated by the corresponding circle, that is converted to generate the portion of the digital value for Stage 101*b*. Similar to Stage 101*a*, the sampling circuit of Stage 101*b* is disabled in the hold phase and the voltage level of stage B sample 506 is not shown during hold phases. The output driver of Stage 101*a* is disabled, and the voltage level of stage A output 504 is pulled to ground reference 518. The voltage level of stage A sample 502 starts from the previously sampled voltage level and gradually rises to track the voltage level of input 510.

Since the voltage level of stage B sample 506 at time t2 (indicated by the circle) is above upper conversion threshold voltage 516, the voltage level of stage B output 508 indicated by the square at time t3 corresponds to stage B sample 506 minus upper conversion threshold voltage 516, and then multiplied by two. In various embodiments, the amplification factor may be any suitable amount. In the illustrated embodiment, the output is double the sampled input.

Between times t2 and t3, input 510 rises above upper overload threshold 511, causing Comparator 103*a* to assert reset 115. At time t3, input 510 remains above upper overload threshold 511, and reset 115 remains asserted. Stage 101*a* enters a reset state in response to entering the hold phase with reset 115 asserted. In the illustrated embodiment, in response to the reset state, Stage 101*a* couples stage A output 504 to ground reference 518. In other embodiments, Stage 101*a* may generate stage A output 504 based on other voltage levels than the voltage level of ground reference 518, such as, for example, conversion threshold voltages 516 or 517. Despite the reset state of Stage 101*a*, Stage 101*b* switches to the sample phase. Stage B output 508 tracks the voltage level of stage A output 504 and stage B output 508 is pulled to ground reference 518 as is normally done in a sample phase.

Between times t3 and t4, the voltage level of input 510 drops below upper overload threshold 511 and reset 115 is de-asserted. At time t4, Stage 101*a* returns to a sample phase and starts to track the voltage level of input 510, with the voltage level of stage A sample 502 starting from the last sample, despite the last sample resulting in a reset condition. Stage 101*b* returns to a hold phase. In various embodiments, a conversion in Stage 101*b* may be aborted or discarded, due to the reset that occurred to Stage 101*a*.

At time t5, Stage 101*a* switches to the hold phase. Stage 101*a* generates stage A output 504 based on the sampled voltage level of stage A sample 502. Stage 101*b* switches to the sample phase and stage B sample 506 is coupled to stage A output 504. The phases alternate again at time t6. The phases alternate again at time t7. Between times t7 and t8, the voltage level of input 510 drops below lower overload threshold 512, causing Comparator 103*b* to again assert reset 115. Since Stage 101*a* is in a hold phase, however, stage A sample 502 remains disabled. Stage 101*a* continues to generate stage A output 504 based on the sampled level of stage A sample 502, thereby allowing Stage 101*b* to continue to sample stage A output 504 during its sample phase.

At time t8, Stage 101*a* switches to the sample phase. The level of input 510 is below lower overload threshold 512 and the voltage level of stage A sample 502 tracks the voltage level of input 510. Stage A reset 515, however, remains low between times t8 and t9. Stage 101*b* continues into its hold phase in which stage B output 508 is generated based on the sampled voltage level of stage B sample 506. At time t9, Stage 101*a* enters the reset state again, and stage A reset 515 is asserted, accordingly.

It is noted that FIG. 5 is merely an example of waveforms that may be associated with a pipelined ADC, such as ADC 100. The waveforms have been simplified to convey the disclosed concepts. In other embodiments, various conditions and imperfections in circuit elements may cause non-linear noise to be coupled into some or all signals. Switching times for devices may cause more gradual transitions between voltage levels than are depicted.

Figure 6:
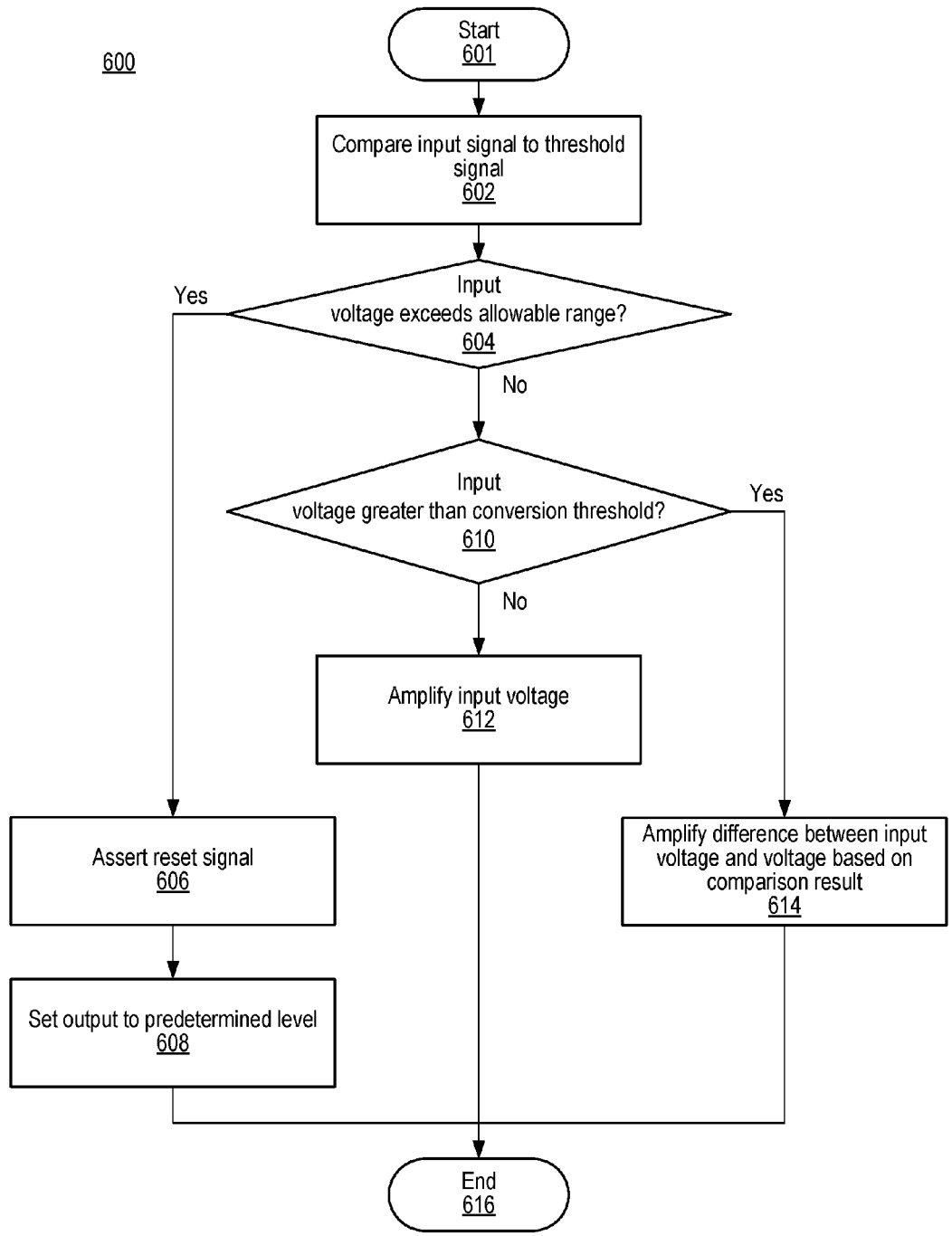
FIG. 6 illustrates a flowchart of a method for protecting an input of an embodiment of an ADC.

Turning to FIG. 6, a flowchart of a method for protecting an input of an embodiment of an ADC is shown. The method 600 may be applied to any of ADCs 100, 200, 300, or 400 in FIGS. 1-4, respectively. In the illustrated embodiment, the method of FIG. 6 is described in reference to ADC 100. Referring collectively to FIGS. 1 and 6, the method may begin in block 601.

An input signal is compared to at least one overload threshold signal (block 602). In the illustrated embodiment, using Comparators 103*a* and 103*b*, respectively, input 110 is compared to upper overload threshold 111 and to lower overload threshold 112. In various embodiments, input 110 may be compared to only one overload threshold, or to more than two overload thresholds. Upper overload threshold 111 may be set equal to a maximum allowable input voltage level and lower overload threshold 112 may be set equal to a minimum allowable input voltage level. In some embodiments, upper overload threshold 111 may be set higher than the maximum voltage level and lower overload threshold 112 may be set lower than the minimum voltage level thus allowing for deviations in the accuracy of each of Comparators 103*a* and 303*b* without limiting a voltage swing range of ADC 100. In other embodiments, upper overload threshold 111 may be set lower than the maximum voltage level and lower overload threshold 112 may be set higher than the minimum voltage level, thereby increasing a level of protection for the input circuits of each of Stages 101.

Further operations of Method 600 may depend on a voltage level of the input signal (block 604). If input 110 is higher than upper overload threshold 111, then Comparator 103*a* asserts its output. In the illustrated embodiment, Comparators 103*a* and 103*b* are synchronized to clock 113, and the assertion of reset 115, therefore, occurs at the end of a sample phase. Likewise, if input 110 is lower than lower overload threshold 112, then Comparator 103*b* asserts its respective output at the end of a sample phase. If either of Comparators 103*a* and 103*b* asserts its respective output, then the voltage level of input 110 exceeds an allowable input voltage range and the method moves to block 606 to assert a reset signal. Otherwise, the method moves to block 610 to compare the input signal to a conversion threshold signal.

If the voltage level of the input signal exceeds an allowable input voltage range, then a reset signal is asserted (block 606). In the illustrated embodiment, the output signals from Comparators 103*a* and 103*b* are received by OR gate 109. Reset 115, therefore, is asserted if either Comparator 103*a* or 103*b* asserts its respective output. Reset 115 is received by Stage 101*a*. In some embodiments, reset 115 may also be sent to circuits coupled to a reset input of a subsequent stage of Stages 101.

The output of Stage 101*a* is set to a predetermined voltage level (block 608). To reach this operation, the voltage level of input 110 has been determined to exceed the allowable input voltage range. To mitigate the excessive voltage level of input 110 being amplified by Stage 101*a* and sent to Stage 101*b*, the voltage level of stage output 114*a* is set to a predetermined level. In the illustrated embodiment, the level of stage output 114*a* is set to a ground reference level. In other embodiments, the level of stage output 114*a* may be set to a voltage level of a previously generated voltage level corresponding to a previous sample of input 110. The method ends in block 616.

If, at block 604, the voltage level of the input signal does not exceed the allowable input voltage range, then continuing operations of the method may depend on a comparison of the input signal to one or more conversion threshold signals (block 610). Input 110 is compared to one or more conversion threshold levels. In the illustrated embodiment, Stage 101*a* compares input 110 to an upper conversion threshold signal and a lower conversion threshold signal. The voltage levels of these two conversion threshold signals may be set to any suitable voltage level. For example, the level of the upper conversion threshold signal may be set to one-half of the maximum allowable input voltage and the lower conversion threshold signal may be set to one-half of the minimum allowable input voltage. If the voltage level of input 110 is between the voltage levels of the upper conversion threshold signal and the lower conversion threshold signal, then the method moves to block 612 to amplify input 110. Otherwise, Method 600 moves to block 614 to amplify a difference between input 110 and one of the upper conversion threshold signal and the lower conversion threshold signal.

If the voltage level of the input signal is between the voltage levels of the two conversion threshold signals, then an output signal is generated by amplifying the voltage level of the input signal (block 612). Stage 101*a* generates stage output 114*a* by amplifying the voltage level of input 110. Any suitable level of amplification may be used. In the illustrated embodiment, the voltage level of input 110 is doubled. The method ends in block 616.

If the voltage level of the input signal is not between the voltage levels of the two conversion threshold signals, then an output signal is generated by amplifying a difference between the voltage levels of the input signal and a voltage based on the comparison result (block 614). If the voltage level of input 110 is greater than the voltage level of the upper conversion threshold signal, then Stage 101a uses a voltage based on the level of the upper conversion threshold signal to subtract from the level of input 110. If, however, the voltage level of input 110 is less than the voltage level of the lower conversion threshold signal, then Stage 101a uses a voltage based on the level of the lower conversion threshold signal to subtract from the level of input 110. Stage 101a then amplifies the difference between the voltage levels to generate stage output 114a. As described above, any suitable level of amplification may be used. The method ends in block 616.

It is noted that method 600 is an example method for protecting an input of an embodiment of an ADC. Variations of Method 600 may be employed in various embodiments of ADCs. For example, a different number of operations may be performed in other embodiments and some operations illustrated to occur in series may be performed in parallel or in another order.

Figure 7:
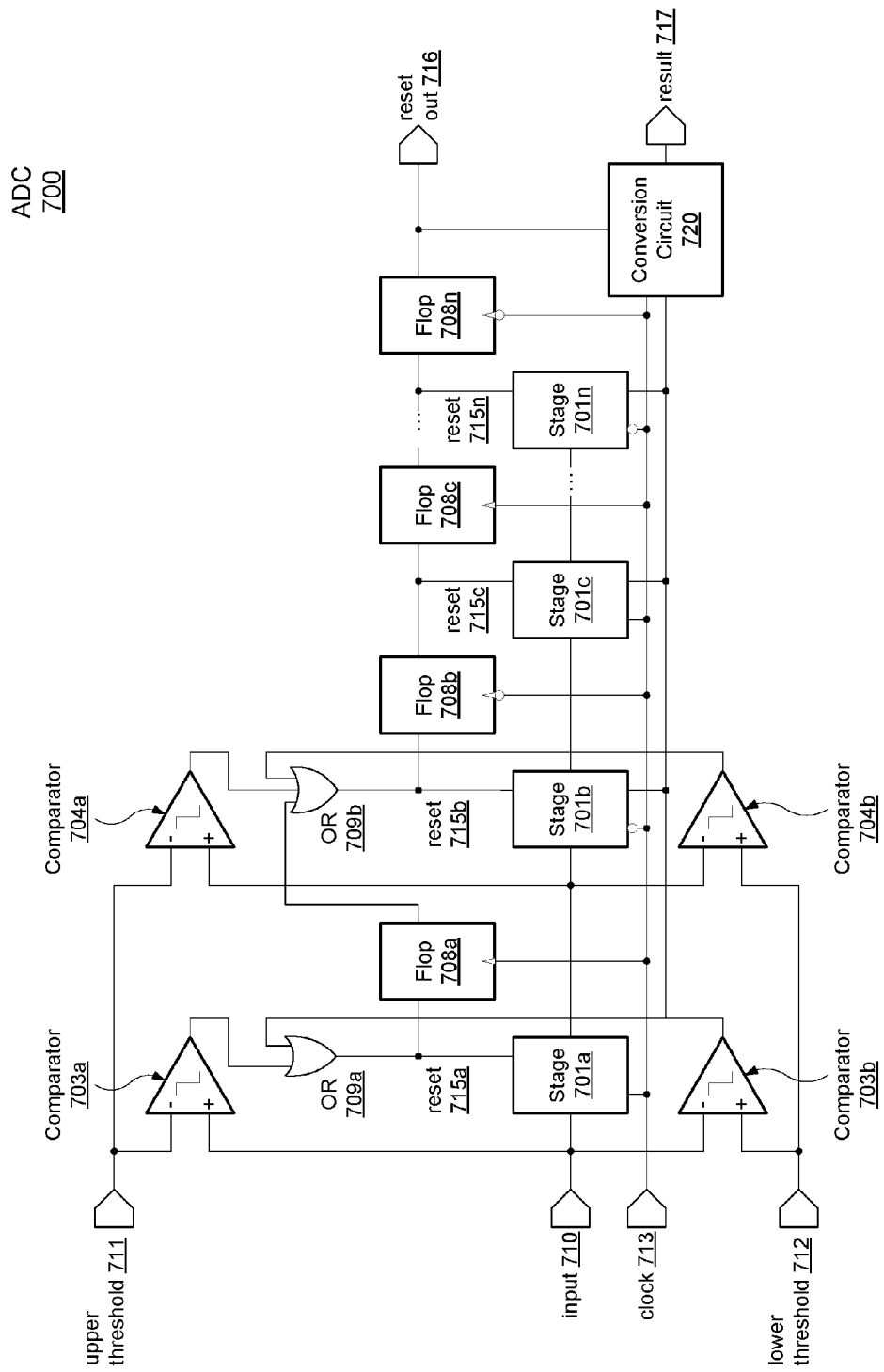
FIG. 7 depicts an embodiment of an ADC that includes a reset signal.

Moving to FIG. 7, an embodiment of an ADC that includes a reset signal is depicted. Similar to ADC 200 in FIG. 2, ADC 700 is another embodiment of a pipelined ADC, which may be included in an SoC device. ADC 700 includes Stage 701a through Stage 701n, collectively referred to as Stages 701. In addition, ADC 700 includes comparison circuits Comparators 703a, 703b, 704a, and 704b. Logic circuits OR gate 209a and OR gate 209b are coupled to Stages 701a and 701b, respectively. ADC 700 also includes latching circuits Flop 708a through Flop 708n, and Conversion Circuit 720. Received signals include input signal 710, upper overload threshold 711, lower overload threshold 712, and clock 713. Output signals reset out 716 and result 717 are generated.

Similar to ADC 200, ADC 700 receives input signal 710 and generates a digital value that is indicative of a voltage level of input signal 710 at a time when input signal 710 is sampled. Except as disclosed below, operation of the components of ADC 700 is as described for the similarly named and numbered components of ADC 200.

In the illustrated embodiment, each of Stages 701 generates a portion of the digital value corresponding to the voltage level of input 710 at a sample time. Each of the portions are collected in Conversion Circuit 720 and combined to generate the digital value as result 717. Since each of Stages 701 generates its respective portion of result 717 after a subsequent edge of clock 713, Conversion Circuit 720 may store the partial result from Stage 701a while Stage 701b and the remaining Stages 701 generate their respective portions of result 717. If one of reset signals 715a through 715n (collectively referred to as reset signals 715) is asserted during a conversion of a given sample, then Conversion Circuit 720 may generate a default or error value for result 717. Any asserted reset signal 715 may, therefore, be synchronized to arrive at Conversion Circuit 720 with a final portion of result 717 from Stage 701n.

To synchronize reset signals 715 with the appropriate sample of input 710, Flops 708a through 708n (collectively referred to as Flops 708) are used. Each of Flops 708 may delay propagation of a corresponding reset signal 715 to a subsequent Stage 701 until a next transition of clock 713 occurs. For example, if reset signal 715a is asserted due to input 710 exceeding a voltage range from upper overload threshold 711 to lower overload threshold 712, then Flop 708a delays propagation of reset signal 715a to OR gate 709b until a falling transition occurs on clock 713. Stage 701a may sample input 710 after a rising transition on clock 713, while Stage 701b may sample an output from Stage 701a after a falling transition on clock 713. Consequently, if reset signal 715a is asserted after input 710 is sampled, then reset signal 715b is asserted after a subsequent rising transition of clock 713. The assertion of reset signal 715b may cause Stage 701b to generate an output at a default or otherwise safe voltage level. Flop 708b may latch the asserted value of reset signal 715b after a subsequent falling transition on clock 713. The remaining Flops 708 may each, in turn, latch the asserted value that originated with reset 715a such that Flop 708n latches the asserted reset value corresponding with Stage 701n sending its portion of result 717 to Conversion Circuit 720. The output of Flop 708n corresponds to reset out 716, which is received by Conversion Circuit 720.

In response to the assertion of reset out 716, Conversion Circuit 720 may generate a default value for result 717. Conversion Circuit 720 may, in addition to, or instead of generating the default value, set an error flag or assert an error signal that may be received by a processor or fault detection circuits in an SoC that includes ADC 700. It is noted that one Flop 708 may be included for each of Stages 701, regardless if a particular Stage 701 includes input protection circuits (e.g., a set of comparison circuits). The use of Flops 708 to manage propagation of a reset signal may, therefore, be applied to any of the ADC circuits discussed herein, in FIGS. 1 through 4.

It is also noted that the embodiment of FIG. 7 is merely an example. Other embodiments may include additional circuit elements or functional circuit blocks. Any suitable number of Stages 701 may be utilized. In other embodiments, any suitable number of stages and corresponding protection circuits may be included. Each stage may include a capability to select a respective overload threshold levels.

Figure 8:
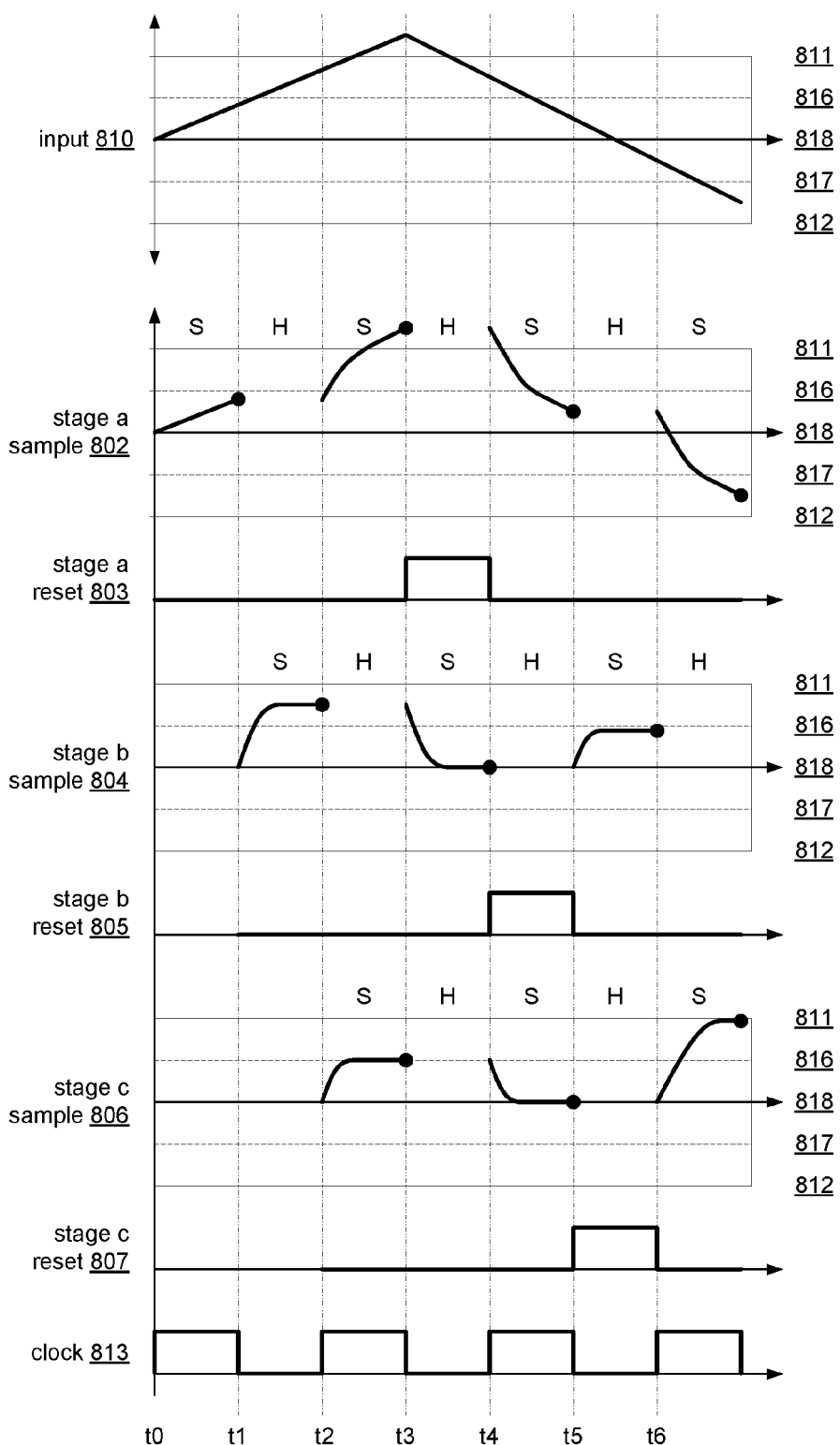
FIG. 8 shows a chart of possible signals associated with managing a reset signal in an embodiment of an ADC.

Proceeding now to FIG. 8, a chart of possible signals associated with managing a reset signal in an embodiment of an ADC is shown. Eight waveforms are illustrated, input 810, stage A sample 802, stage A reset 803, stage B sample 804, stage B reset 805, stage C sample 806, stage C reset 807, and clock 813. For waveforms 810, 802, 804, and 806, lines are included to indicate upper overload threshold 811, lower overload threshold 812, upper conversion threshold voltage 816, and lower conversion threshold voltage 817. The middle line indicates ground reference 818. The waveforms of FIG. 8 may be applied to any of ADCs 100, 200, 300, 400, or 700 in FIGS. 1-4 and 7, respectively. In the illustrated embodiment, the waveforms of FIG. 8 are described in reference to ADC 700.

In the illustrated embodiment, input 810 corresponds to input signal 710, clock 813 corresponds to clock 713, upper overload threshold 811 corresponds to upper overload threshold 711, lower overload threshold 812 corresponds to lower overload threshold 712. Stage A sample 802, stage B sample 804, and stage C sample 806 are examples of an internal signals that may correspond to sample and hold circuits within Stages 701a, 701b, and 701c, respectively. For waveforms 802, 804, and 806, each phase of clock 813 is labeled with an "S" or an "H" to signify if the corresponding Stage 701 is in a sample phase or hold phase. During a sample phase, a given Stage 701 couples an internal sampling circuit to the corresponding input, allowing the sampling circuit to track the voltage level of the input. Upon entering a hold phase, the respective input is decoupled from the sampling circuit and the voltage level of sampling circuit is held while the given Stage 701 compares the sampled voltage level to upper conversion threshold voltage 816 and lower conversion threshold voltage 817, generating a portion of a digital value. It is noted that the sample and hold phases for stage A sample 802, stage B sample 804 and stage C sample 806 alternate from stage to stage for each clock 813 phase.

From time t0 to time t2, ADC may begin a conversion of input 810. Between times t0 and t1, Stage 701a samples input 810, tracking the voltage level of input 810. At the end of the sample phase, at time t1, stage A reset 803 remains low as input 810 does not exceed either upper overload threshold 811 or lower overload threshold 812. Stages 701b and 701c, meanwhile, may be inactive if ADC 100 is performing a first conversion since being enabled or processing an earlier conversion if the current conversion is not the first.

At time t1, Stage 701a switches into a hold phase while Stage 701b enters a sample phase. While Stage 701b is in the sample phase, stage B sample 804 may start to track the output of Stage 701a. Since Stage 701a is in a hold phase, the sampling circuit of Stage 701a is disabled and the voltage level of stage A sample 802 may be indeterminate, and therefore, stage A sample 802 is not shown during hold phases. In the illustrated embodiment, the output from Stage 701a is amplified before being sent to Stage 701b. Stage B reset is low, reflecting that the output from Stage 701a is between upper and lower overload thresholds 811 and 812. Stage 701c may remain either idle or processing a previous conversion depending on the current state of ADC 700.

At time t2, the phases of Stages 701a and 701b switch to the sample phase and hold phase, respectively. Stage 701c enters a sample phase for the current conversion, sampling the output from Stage 701b. Between times t2 and t3, input 810 rises above upper overload threshold 811. Stage A reset 803 does not assert before the end of the sample phase for Stage 701a.

At time t3, stage A reset 803 asserts high and, in response, Stage 701a enters a reset state. The output of Stage 701a is driven to a predetermined safe voltage level. Stage 701b, remains in a sample phase, tracking the safe voltage level output from Stage 701a. Stage 701c remains in a hold phase, converting the sampled voltage level indicated by the circle on stage C sample 806. It is noted that stage A reset 803 remains asserted despite the level of input 810 falling back below upper overload threshold 811. Stage A reset 803 remains asserted high until time t4.

Stage 701a, at time t4, exits the reset state and returns to a sample phase. Stage A sample 802 samples input 810 and stage A reset 803 returns to a low value. The output of Flop 708a, is asserted, in response to a rising transition of clock 813, before stage A reset 803 is de-asserted. Stage B reset 805, receives the asserted signal from Flop 708a, and Stage 701b enters the reset state and outputs a safe voltage level. Stage 701c enters a sample phase and stage C sample 806 tracks the safe voltage level output from Stage 701b.

At time t5, Flop 708b latches a value of stage B reset 805 upon the falling transition of clock 813, causing stage C reset 807 to assert high. Stage 701c, therefore, enters a reset state, including generating the safe voltage level at its output. Stage 701a switches to a hold phase, while Flop 708a latches the low value of stage A reset 803, causing stage B reset 805 to transition back to a low value. Stage 701b enters a sample phase.

At time t6, Stage 701a switches back to a sample phase and Stage 701b switches to a hold phase. The rising transition on clock 813 causes Flop 708b to latch the current low value of stage B reset 805, thereby causing stage C reset 807 to return to a low value. Stage 701c exits the reset state and enters a sample phase.

It is noted that the waveforms of FIG. 8 are examples corresponding to an embodiment of an ADC. In some embodiments, the rate of change of input 810 may not be as rapid as illustrated in comparison to clock 813. Furthermore, the waveforms are simplified for clarity, and, in other embodiments, one or more of the waveforms may include anomalies due to spurious noise occurring in the system, or imperfections of circuits due to semiconductor manufacturing tolerances.

Figure 9:
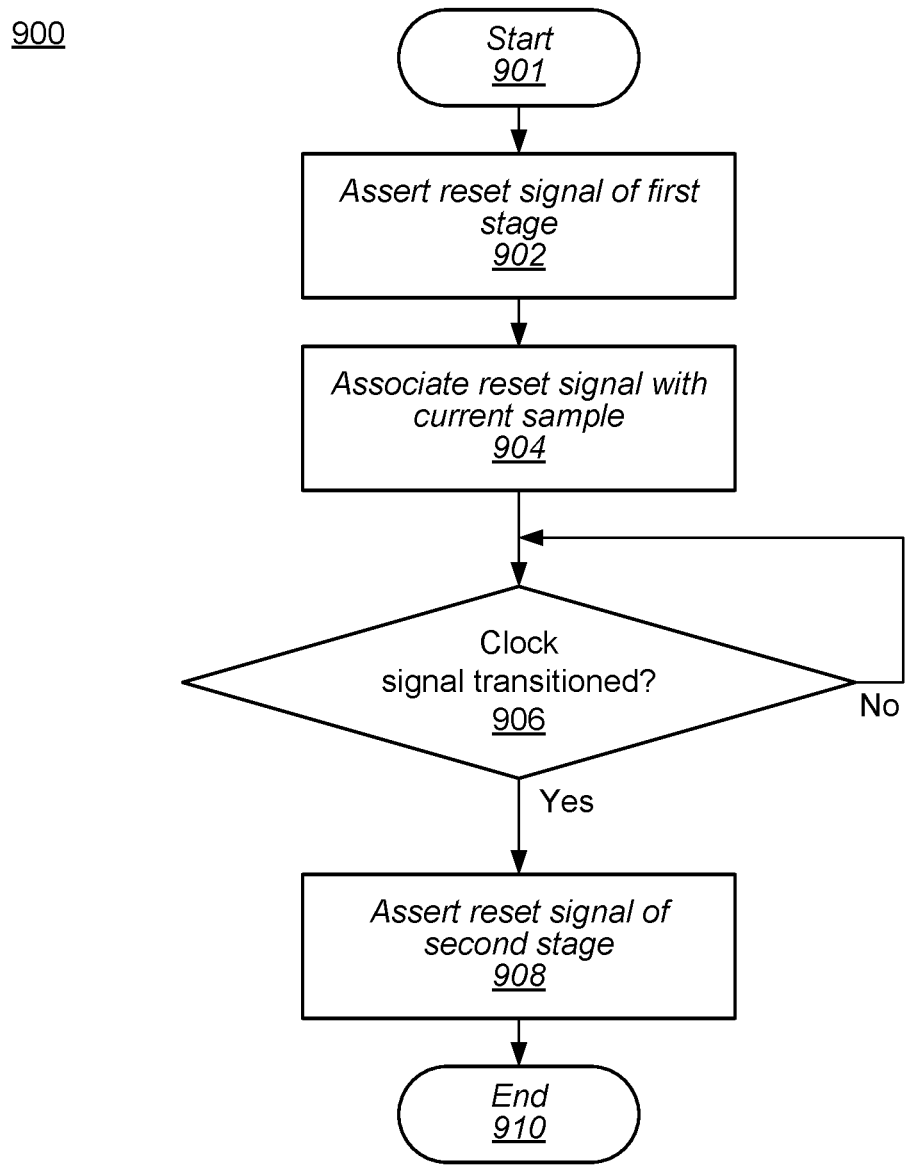
FIG. 9 illustrates a flowchart of a method for managing a reset signal in an embodiment of an ADC.

Turning now to FIG. 9, a flowchart of a method for managing a reset signal in an embodiment of an ADC is illustrated. Method 900 may be applied to any of ADCs 100, 200, 300, 400, or 700 in FIGS. 1-4 and 7, respectively. Referring collectively to ADC 700 in FIG. 7 and the method of FIG. 9, Method 900 begins in block 901.

A reset signal for a given stage of a plurality of ADC stages is asserted (block 902). In the illustrated embodiment, reset 715a may be asserted in response to either Comparator 703a determining that input 710 is above upper overload threshold 711 or Comparator 703b determining that input 710 is below lower overload threshold 712. Comparators 703a and 703b are synchronized to clock 713, such that reset 715a is asserted at the end of a sample phase for Stage 701a. In other embodiments, reset 715b may be asserted based on a similar determination that the output of Stage 701a is above upper overload threshold 711 or below lower overload threshold 712.

The assertion of reset 715a is associated with a current sample being processed in the given stage (block 904). Stage 701a, in the illustrated embodiment, is at the end of a sample phase when reset 715a is asserted. The assertion of reset 715a may cause Stage 701a to enter a reset state as described above. The assertion of reset 715a is associated with the sample being held in the current hold phase. As Stages 701b through 701n receive input signals associated with the associated sample, respective reset signals for each stage are asserted. As used herein "associating" an assertion of a reset signal to a sample refers to asserting the reset signal for each stage of Stages 701 as the associated sample progresses through each stage.

Further operations of Method 900 may depend on transitions of a clock signal (block 906). Reset 715a is received as an input by Flop 708a in the illustrated embodiment. Flop 708a latches a state of reset 715a upon a rising transition of clock 713. In addition, Stage 701b enters a hold phase upon a rising transition of clock 713. Flop 708a, therefore, delays propagation of the state of reset 715a to reset 715b to align with a hold phase of Stage 701b. If clock 713 transitions high, then the method moves to block 908 to assert reset 715b. Otherwise, the method remains in block 906.

In response to the transition of the clock signal, the reset signal for the stage subsequent to the given stage is asserted (block 908). In the illustrated embodiment, a rising transition on clock 713 causes Flop 708a to latch the asserted state of reset 715a. The output of Flop 708a is coupled to an input of OR gate 709b. The assertion of the output of Flop 708a, therefore, causes reset 715b to assert. The rising transition of clock 713 also causes Stage 701b to enter a hold phase. Reset 715b is therefore, asserted synchronous to Stage 701b entering the hold phase for the associated sample. Rather than processing the associated sample, Stage 701b enters a reset state. The method ends in block 910.

It is noted that method 900 is merely an example of a method for managing a reset signal in an embodiment of an ADC. In other embodiments, a different number of operations may be performed and/or some operations illustrated to occur in series may be performed in parallel or in another order. Furthermore, the operations of Method 900 may be repeated for each stage of Stages 701.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a series of analog-to-digital converter (ADC) stages, wherein an input of a first ADC stage of the series of ADC stages is coupled to an input signal and wherein the first ADC stage is configured to:
compare a voltage level of the input signal to one or more conversion threshold levels to generate a result in response to a transition of a clock signal;
generate an output signal of the first ADC stage based on a value of the result; and
in response to an assertion of a first reset signal, set a voltage level of the output signal to a particular voltage level; and
a particular comparison circuit coupled to the first ADC stage of the series of ADC stages, wherein the particular comparison circuit is configured to assert the first reset signal in response to a determination that the voltage level of the input signal is outside of a first operating range defined by a first upper overload threshold level and a first lower overload threshold level;
wherein an input of a second ADC stage of the series of ADC stages is coupled to the output signal of the first ADC stage and an output signal of the second ADC stage is coupled to an input of a third ADC stage; and
a second comparison circuit coupled to the input of the third ADC stage, wherein the second comparison circuit is configured to assert a second reset signal based on the voltage level of the input signal in response to a determination that the voltage level of the output signal of the second stage is outside of a second operating range defined by a second upper overload threshold level, different than the first upper overload threshold level and a second lower overload threshold level different than the first lower overload threshold level.

2. The apparatus of claim 1, wherein the particular comparison circuit is further configured to set the first upper overload threshold level to a voltage level that is greater than a maximum allowable voltage level of the first ADC stage, and to set the first lower overload threshold level to a voltage level that is less than a minimum allowable voltage level of the first ADC stage.

3. The apparatus of claim 2, wherein the second comparison circuit is further configured to set the second upper overload threshold level to a voltage level that is less than a maximum allowable voltage level of the third ADC stage, and to set the second lower overload threshold level to a voltage level that is greater than a minimum allowable voltage level of the third ADC stage.

4. The apparatus of claim 1, wherein a respective input of each ADC stage of a proper subset of the series of ADC stages is coupled to a respective comparison circuit.

5. The apparatus of claim 4, wherein at least one comparison circuit coupled to at least one ADC stage of the proper subset is configured to assert a respective reset signal in response to a determination that a voltage level of its respective input is outside of the first operating range.

6. The apparatus of claim 5, wherein remaining comparison circuits coupled to respective remaining ADC stages of the proper subset are configured to assert a respective reset signal in response to a determination that a voltage level of their respective inputs is outside of the second operating range.

7. The apparatus of claim 1, further comprising: a synchronization circuit configured to assert a second reset signal, coupled to the second ADC stage of the series of ADC stages in response to another transition of the clock signal and in response to the assertion of the first reset signal.

8. A method for operating an analog-to-digital converter (ADC), the method comprising:
comparing, by a first ADC stage of a series of ADC stages, a voltage level of an input signal to one or more conversion threshold levels to generate a result in response to particular transitions of a clock signal;
in response to a first transition of the clock signal, generating an output signal of the first ADC stage based on the result;
asserting, by a first comparison circuit coupled to the first ADC stage, a first reset signal in response to determining that the voltage level of the input signal exceeds an first allowable range of voltage levels;
in response to the assertion of the first reset signal, setting, by the first ADC stage, a voltage level of the output signal to a particular voltage level;
comparing, by a second ADC stage of the series of ADC stages, a voltage level of the output signal of the first ADC stage in response to a second transition of the clock signal, occurring after the first transition; and
asserting, by a second comparison circuit coupled to the second ADC stage, a second reset signal in response to determining that the voltage level of the output signal of the first ADC stage exceeds a second allowable range of voltage levels, wherein the first allowable range and the second allowable range are different.

9. The method of claim 8, wherein each ADC stage of a proper subset of the series of ADC stages is coupled to a respective comparison circuit.

10. The method of claim 8, wherein the first allowable range of voltage levels includes voltage levels less than or equal to a first upper overload threshold level and greater than or equal to a first lower overload threshold level, and wherein the first upper overload threshold level is based on a maximum allowable voltage level of the first ADC stage and the first lower overload threshold level is based on a minimum allowable voltage level of the first ADC stage.

11. The method of claim 10, wherein the second allowable range of voltage levels includes voltage levels less than or equal to a second upper overload threshold level and greater than or equal to a second lower overload threshold level, wherein the first upper overload threshold level is different than the second upper overload threshold level and the first lower overload threshold level is different than the second lower overload threshold level.

12. The method of claim 8, further comprising comparing, by a third ADC stage of the series of ADC stages, a voltage level of the output signal of the second ADC stage in response to a third transition of the clock signal, occurring after the second transition.

13. The method of claim 12, further comprising asserting a third reset signal, in response to third transition of the clock signal, and in response to asserting the second reset signal.

14. A system comprising:
a circuit configured to generate an analog signal, wherein a voltage level of the analog signal varies over time;
a clock source configured to generate a clock signal; and
an analog to digital converter (ADC) including a series of ADC stages and a plurality of comparison circuits, wherein the ADC is configured to:
compare a voltage level of the analog signal to one or more conversion threshold levels to generate a result using a first ADC stage of the series of ADC stages in response to a transition of the clock signal;
generate an output signal of the first ADC stage based on the result;
using a particular comparison circuit of the plurality of comparison circuits, assert a first reset signal in response to a determination that the voltage level of the analog signal is outside of a first operating range defined by a first upper overload threshold level and a first lower overload threshold level; and
in response to the assertion of the first reset signal, set a voltage level of the output signal of the first ADC stage to a particular voltage level;
wherein an input of a second ADC stage of the series of ADC stages is coupled to the output signal of the first ADC stage and an output of the second ADC stage is coupled to an input of a third ADC stage; and
wherein the input of the third ADC stage is coupled to another comparison circuit of the plurality of comparison circuits that is configured to assert another reset signal in response to a determination that the voltage level of the output of the second ADC stage is outside of a second operating range defined by a second upper overload threshold level, different from the first upper overload threshold level, and a second lower overload threshold level, different from the first lower overload threshold level.

15. The system of claim 14, wherein the ADC is further configured to set the first upper overload threshold level to a voltage level that is greater than a maximum allowable voltage level of the first ADC stage, and to set the first lower overload threshold level to a voltage level that is less than a minimum allowable voltage level of the first ADC stage.

16. The system of claim 14, wherein the another comparison circuit is further configured to set the second upper overload threshold level to a voltage level that is less than a maximum allowable voltage level of the third ADC stage, and to set the second lower overload threshold level to a voltage level that is greater than a minimum allowable voltage level of the third ADC stage.

17. The system of claim 14, wherein a respective input of each ADC stage of a proper subset of the series of ADC stages is coupled to a respective comparison circuit.

18. The system of claim 17, wherein at least one comparison circuit coupled to at least one ADC stage of the proper subset is configured to assert a respective reset signal in response to a determination that a voltage level of its respective input is outside of the first operating range.

19. The system of claim 18, wherein remaining comparison circuits coupled to respective remaining ADC stages of the proper subset are configured to assert their respective reset signal in response to a determination that a voltage level of their respective inputs is outside of the second operating range.

20. The system of claim 14, wherein the ADC is further configured to assert a second reset signal, coupled to the second ADC stage of the series of ADC stages in response to another transition of the clock signal and in response to the assertion of the first reset signal.

* * * * *